(12) United States Patent
Oh et al.

(10) Patent No.: US 9,434,127 B2
(45) Date of Patent: Sep. 6, 2016

(54) PROTECTIVE SHEET AND ORGANIC LIGHT EMITTING DISPLAY APPARATUS INCLUDING THE SAME

(71) Applicant: SAMSUNG DISPLAY CO., LTD., Yongin, Gyeonggi-Do (KR)

(72) Inventors: Hyunjoon Oh, Yongin (KR); Sangil Park, Yongin (KR); Hyejin Oh, Yongin (KR); Jeoungsub Lee, Yongin (KR); Minhoon Choi, Yongin (KR); Insun Hwang, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/628,501

(22) Filed: Feb. 23, 2015

(65) Prior Publication Data

US 2016/0079562 A1    Mar. 17, 2016

(30) Foreign Application Priority Data

Sep. 16, 2014    (KR) ........................ 10-2014-0122933

(51) Int. Cl.
*H01L 51/00*    (2006.01)
*B32B 3/14*     (2006.01)
*H01L 51/52*    (2006.01)
*H01L 27/32*    (2006.01)

(52) U.S. Cl.
CPC ............. *B32B 3/14* (2013.01); *H01L 51/5237* (2013.01); *H01L 27/323* (2013.01); *H01L 51/524* (2013.01); *H01L 2251/5338* (2013.01)

(58) Field of Classification Search
CPC ........... H01L 51/0545; H01L 51/0036; H01L 51/0541; H01L 51/5012
USPC .................................. 257/40, 433, 709, 790
See application file for complete search history.

(56) References Cited

U.S. PATENT DOCUMENTS

| | | | |
|---|---|---|---|
| 8,817,458 B2 * | 8/2014 | Clayton .................. | G06F 1/184 361/679.31 |
| 2004/0125266 A1 * | 7/2004 | Miyauchi .......... | B01L 3/502761 349/57 |
| 2010/0238548 A1 | 9/2010 | Watanabe et al. | |
| 2011/0250442 A1 | 10/2011 | Castro et al. | |
| 2014/0010972 A1 | 1/2014 | Yang et al. | |

FOREIGN PATENT DOCUMENTS

| | | |
|---|---|---|
| JP | 2004-196008 A | 7/2004 |
| KR | 10-2011-0028248 A | 3/2011 |
| KR | 10-2012-0000042 A | 1/2012 |
| KR | 10-2014-0011809 A | 1/2014 |

OTHER PUBLICATIONS

Zhu et al., "Structure and Mechanical Performance of a "Modern" Fish Scale", Advanced Engineering Materials 2012, 14, No. 4, pp. B185-B194.
Zhu et al., "Puncture Resistance of the Scaled Skine From Striped Bass: Collective Mechanisms and Inspiration for New Flexible Armor Designs", Journal of the Mechanical Behavior of Biomedical Materials, 24, 2013, pp. 30-40.

* cited by examiner (Continued)

*Primary Examiner* — Quoc Hoang
(74) *Attorney, Agent, or Firm* — Lee & Morse, P.C.

(57) ABSTRACT

A protective sheet, including a base substrate; and a plurality of protective units on a first surface of the base substrate and spaced apart from each other, each of the plurality of protective units including a pillar protruding from the first surface of the base substrate perpendicularly to the first surface, and a hard coating layer on lateral surfaces of the pillar, the plurality of protective units being elastically bendable and hard coating layers of neighboring protective units overlapping each other when the plurality of protective units are bent.

21 Claims, 4 Drawing Sheets

PROTECTIVE SHEET AND ORGANIC LIGHT EMITTING DISPLAY APPARATUS INCLUDING THE SAME

CROSS-REFERENCE TO RELATED APPLICATION

Korean Patent Application No. 10-2014-0122933, filed on Sep. 16, 2014, in the Korean Intellectual Property Office, and entitled: "Protective Sheet and Organic Light Emitting Display Apparatus Including the Same," is incorporated by reference herein in its entirety.

BACKGROUND

1. Field

One or more exemplary embodiments relate to a protective sheet and an organic light emitting display apparatus including the protective sheet.

2. Description of the Related Art

Various flat display apparatuses which are thin, lightweight, and consume little power have been introduced. Flat panel display apparatuses may include organic light emitting display apparatuses, plasma display apparatuses, and liquid crystal display apparatuses. Organic light emitting display apparatuses may be considered as next generation display apparatuses that may be thin, lightweight, and may have advantages such as wide viewing angles, fast response speed, and low power consumption.

SUMMARY

Embodiments may be realized by providing a protective sheet, including a base substrate; and a plurality of protective units on a first surface of the base substrate and spaced apart from each other, each of the plurality of protective units including a pillar protruding from the first surface of the base substrate perpendicularly to the first surface, and a hard coating layer on lateral surfaces of the pillar, the plurality of protective units being elastically bendable and hard coating layers of neighboring protective units overlapping each other when the plurality of protective units are bent.

The base substrate may be stretchable, and the pillars may include a same material as the base substrate.

Each of the plurality of protective units may have a lower end portion adjacent to the base substrate on which the hard coating layer is not formed.

A distance between two adjacent protective units may be equal to or less than half of a length of the pillar.

In each of the plurality of protective units, a horizontal cross-sectional area of the pillar may increase from an upper portion to a lower portion thereof relative to the base substrate.

In each of the plurality of protective units, an upper surface of the pillar further from the base substrate may be convex upward.

Each of the plurality of protective units may include a plurality of branches protruding from the lateral surfaces of the pillar.

The hard coating layer may be on lateral surfaces of the plurality of branches.

An angle between each of the branches and the first surface may be greater than 0° and less than 90°.

Embodiments may be realized by providing an organic light emitting display apparatus, including a substrate; a display unit on the substrate; a functional layer on the display unit; a sealing portion on the substrate along an outer portion of the display unit for bonding the substrate and the functional layer to each other; and a protective sheet on the functional layer, the protective sheet including a base substrate; and a plurality of protective units on a first surface of the base substrate, the plurality of protective units being spaced apart from each other, and each of the plurality of protective units including a pillar protruding from the first surface of the base substrate perpendicularly to the first surface, and a hard coating layer on lateral surfaces of the pillar, and the plurality of protective units being elastically bendable, and hard coating layers of neighboring protective units contacting each other when the plurality of protective units are bent.

The functional layer may include a sealing substrate, a polarization layer, and a touchscreen layer.

Each of the plurality of protective units may have a lower end portion adjacent to the base substrate on which the hard coating layer is not formed.

A distance between two adjacent protective units may be equal to or less than half of a length of the pillar.

In each of the plurality of protective units, a horizontal cross-sectional area of the pillar may increase from an upper portion to a lower portion thereof relative to the base substrate.

In each of the plurality of protective units, an upper surface of the pillar further from the base substrate may be convex upward.

Each of the plurality of protective units may include a plurality of branches protruding from the lateral surfaces of the pillar.

The hard coating layer may be on lateral surfaces of the plurality of branches.

An angle between each of the branches and the first surface may be greater than 0° and less than 90°.

The organic light emitting display apparatus may further include a filling material which is between the substrate and the functional layer, the filling material covering the display unit.

The substrate, the filling material, the functional layer, and the base substrate may be stretchable, and the pillar may include a same material as the base substrate.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
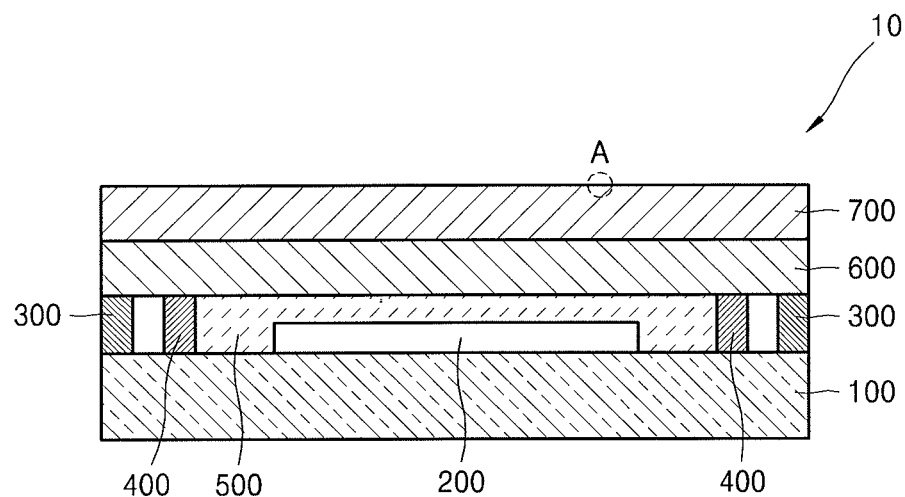
FIG. 1 illustrates a schematic plan view of an organic light emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration.

While such terms as "first," "second," etc., may be used to describe various components, such components must not be limited to the above terms. The above terms are used only to distinguish one component from another.

The terms used in the present specification are merely used to describe particular embodiments, and are not intended to be limiting. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

In the case where a position relationship between two items is described with the terms "on", "under", or "between", one or more items may be interposed therebetween unless the term "directly" is used in the expression. The terms may be understood by referring to the drawings.

As used herein, the term "and/or" includes any and all combinations of one or more of the associated listed items. Expressions such as "at least one of," when preceding a list of elements, modify the entire list of elements and do not modify the individual elements of the list.

Figure 2:
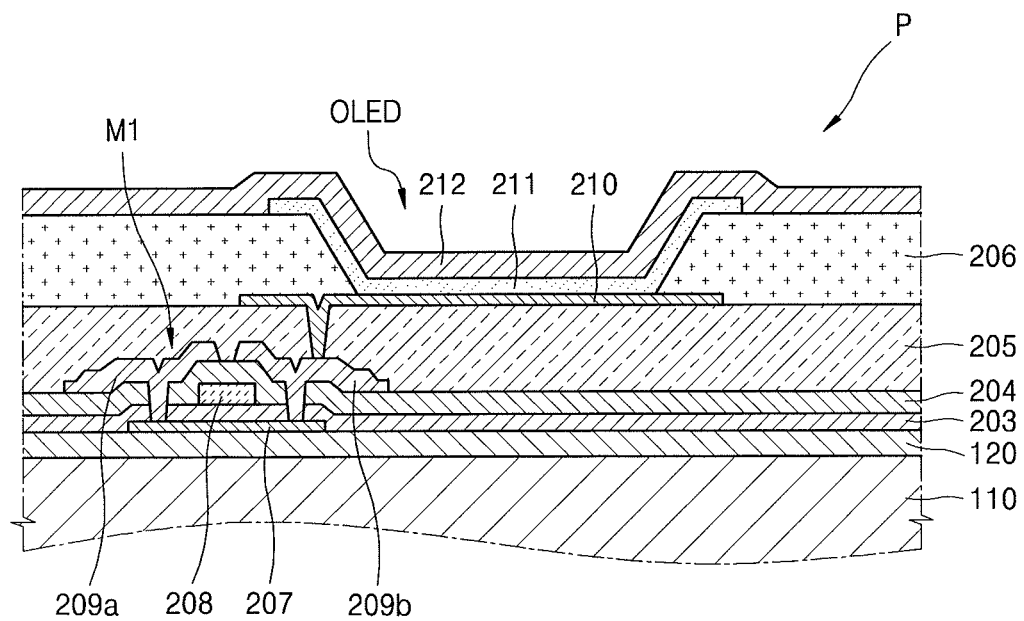
FIG. 2 illustrates a schematic cross-sectional view of an example of a pixel unit included in the organic light emitting display apparatus of FIG. 1.
Figure 3:
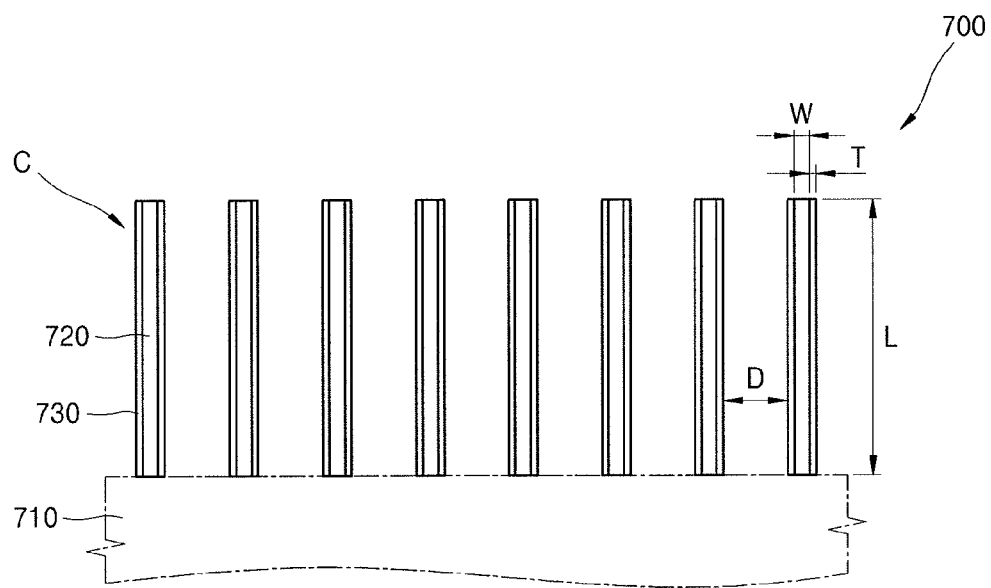
FIG. 3 illustrates an enlarged schematic cross-sectional view of part A of FIG. 1.
Figure 4:
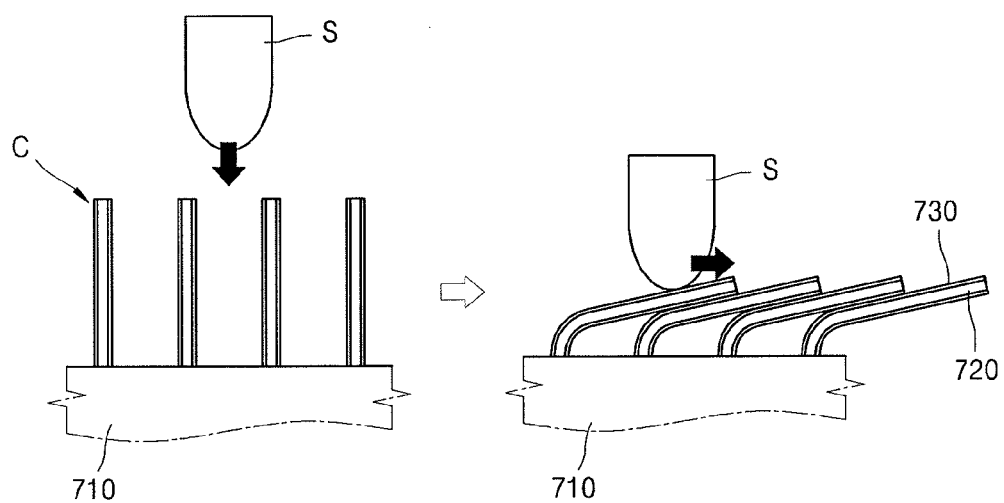
FIG. 4 illustrates a schematic cross-sectional view of a protective sheet of the organic light emitting display apparatus of FIG. 1.
Figure 5:
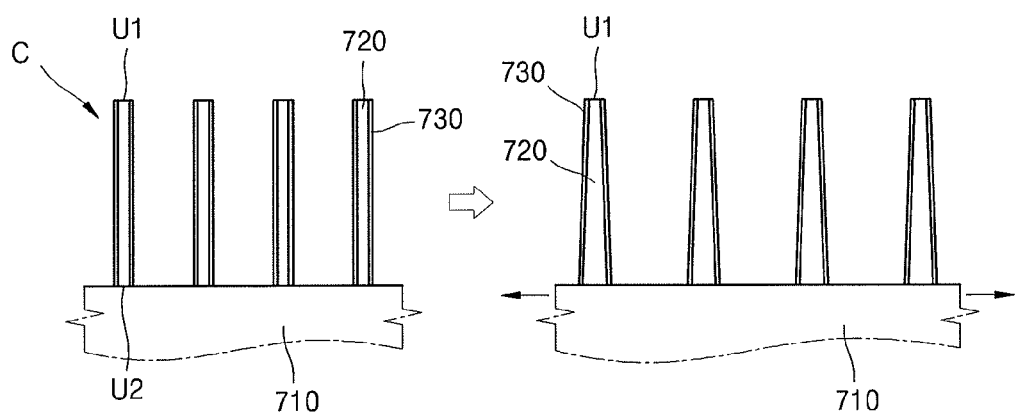
FIG. 5 illustrates a schematic cross-sectional view of the protective sheet when stretching the organic light emitting display apparatus of FIG. 1.

FIG. 1 illustrates a schematic plan view of an organic light emitting display apparatus 10 according to an embodiment, FIG. 2 illustrates a schematic cross-sectional view of an example of a pixel unit included in the organic light emitting display apparatus 10 of FIG. 1, and FIG. 3 illustrates an enlarged schematic cross-sectional view of a part A of FIG. 1. FIG. 4 illustrates a schematic cross-sectional view of a protective sheet of the organic light emitting display apparatus of FIG. 1, and FIG. 5 illustrates a schematic cross-sectional view of the protective sheet when stretching the organic light emitting display apparatus of FIG. 1.

Referring to FIGS. 1 through 3, the organic light emitting display apparatus 10 according to an embodiment may include a substrate 100, a display unit 200 disposed on the substrate 100, a functional layer 600 disposed on the display unit 200, a sealing portion 300 applied on the substrate 100 along an outer portion of the display unit 200 and bonding the substrate 100 to the functional layer 600, and a protective sheet 700 formed on the functional layer 600. The organic light emitting display apparatus 10 may further include a filling material 500 covering the display unit 200 between the substrate 100 and the functional layer 600, and a getter 400 between the outer portion of the display unit 200 and inside of the sealing portion 300.

The substrate 100 may be formed of a material having an excellent elongation rate. For example, the substrate 100 may be formed of polyurethane, polyurethane acrylate, polydimethylsiloxane (PDMS), and hexamethyldisiloxane (HMDSO). The substrate 100 may be formed of an above material having flexible property, and the substrate 100 may be stretchable two-dimensionally.

For example, the substrate 100 may include a plurality of islands 110 arranged as planar grating shapes, and base portions (not shown) formed between the plurality of islands 110 and having lower height than that of the islands 110. The substrate 100 may be stretched, lengths of the base portions (not shown) may increase, and the islands 110 having greater thickness may change less, relatively.

The display unit 200 may include a plurality of pixel units P. The pixel units P may be formed on the islands 110, for example. The substrate 100 may be two-dimensionally stretched or curved, the pixel units P may be formed on the islands 110, shapes of the islands may be changed less, and the pixel units P may not be damaged.

Each of the pixel units P may include red (R), green (G), and blue (B) sub-pixels, and each of the sub-pixels may include a driving thin film transistor (TFT) M1 and an organic light emitting device OLED formed on the substrate 100.

An insulating layer 120 such as a barrier layer and/or a buffer layer, that may prevent impurity ions from dispersing through the substrate 100, that may prevent moist or external air from infiltrating into the substrate 100, and that may planarize a surface, may be formed on an upper surface of the substrate 100, for example, at least on upper surfaces of the islands 110.

An active layer 207 of the driving TFT M1 may be formed of a semiconductor material on the insulating layer 120, and a gate insulating layer 203 may be formed to cover the active layer 207. The active layer 207 may be formed of inorganic semiconductor such as amorphous silicon or polysilicon, or organic semiconductor.

A gate electrode 208 may be formed on the gate insulating layer 203, and an interlayer insulating layer 204 may be formed to cover the gate electrode 208. A source electrode 209a and a drain electrode 209b may be formed on the interlayer insulating layer 204, and a passivation layer 205 and a pixel defining layer 206 may be sequentially disposed to cover the source and drain electrodes 209a and 209b.

The gate electrode 208, the source electrode 209a, and the drain electrode 209b may be formed of, for example, metal such as Al, Mo, Au, Ag, Pt/Pd, or Cu. A resin paste in which the above metal is contained as powder type may be applied or a conductive polymer may be used to form the gate electrode 208, the source electrode 209a, and the drain electrode 209b.

The gate insulating layer 203, the interlayer insulating layer 204, the passivation layer 205, and the pixel defining layer 206 may be formed of an insulating material in a single-layered or a multi-layered structure, for example, an organic material, an inorganic material, or a composite of the organic/inorganic materials.

The organic light emitting device OLED may display predetermined image information by emitting red, green, and blue light according to flow of electric current, and the organic light emitting device OLED may include a pixel electrode 210 connected to one of the source electrode 209a and the drain electrode 209b of the driving TFT M1, an opposite electrode 212 disposed to cover entire pixels, and an organic emission layer 211 disposed between the pixel electrode 210 and the opposite electrode 212 to emit light.

The pixel units P may be directly formed on the plurality of islands 110. In an embodiment, the pixel units P may be formed on a carrier substrate (not shown) first, and then may be transferred onto the islands 110.

The sealing portion 300 may be applied on the substrate 100 along the outer portion of the display unit 200, the substrate 100 may be bonded to the functional layer 600, and external moist and oxygen may be prevented from infiltrating into the organic light emitting display apparatus 10. The sealing portion 300 may be formed of, for example, an ultraviolet (UV)-curing resin or a thermosetting resin such as elastomer silicon.

The functional layer 600 may include, for example, a sealing substrate, a polarization layer, or a touchscreen layer, and may be formed to be stretchable two-dimensionally. The sealing substrate, the polarization layer, and the touchscreen layer may be attached by an adhesive layer.

The sealing substrate may be bonded to the substrate 100 by the sealing portion 300, the external moisture and oxygen may be prevented from infiltrating into the organic light emitting display apparatus 10, and the organic light emitting device OLEC may be protected against external shock.

The sealing substrate may be formed of, for example, polyurethane, polyurethane acrylate, PDMS, and HMDSO.

The polarization layer may only transmit light vibrating in the same direction as a polarization axis and may absorb or reflect light vibrating in other directions, in the light emitted from the display unit 200. The polarization layer may include a phase difference film that shifts a phase difference of $\lambda/4$ to two polarization components that are perpendicular to each other to change a linear polarization into a circular polarization or to change the circular polarization into the linear polarization, and a polarization film that aligns a direction of light that has passed through the phase difference film and divides the light into two polarization components that are perpendicular to each other to transmit only one component and reflect or disperse the other component.

The touchscreen layer may include a touch sensor in which a plurality of first electrodes and a plurality of second electrodes are alternately arranged. The touch sensor may be, for example, a capacitive type that determines whether a portion is touched or not by sensing variation in an electrostatic capacitance generating in the plurality of first electrodes and the plurality of second electrodes that are alternately arranged.

The getter 400 may be applied between the outer portion of the display unit 200 and the inside of the sealing portion 300, and may include one of alkali metal oxide, alkali earth metal oxide, metal halide, lithium sulfate, metal sulfate, metal perchlorate, silica gel, and phosphorous pentoxide, e.g., a material that reduces or prevents degradation of lifespan of the organic light emitting device OLED, for example, due to the moisture and oxygen.

The filling material 500 may fill a space between the substrate 100 and the functional layer 600, and the organic light emitting display apparatus 10 may be prevented from being damaged, for example, due to the shock, and mechanical stability of the organic light emitting display apparatus 10 may be ensured.

The filling material 500 may be a material that may be stretchable. For example, the filling material 500 may be elastomeric polyurethane or elastomeric silicon.

The protective sheet 700 may protect the display unit 200 against the external shock, and may have a light transmittance of 80% or greater in a visible range.

The protective sheet 700 may include a base substrate 710 and a plurality of protective units C formed on a first surface of the base substrate 710. A second surface of the base substrate 710, which is opposite to the first surface, may be attached to the functional layer 600, e.g., by an adhesive layer.

The base substrate 710 may be formed of a stretchable material, for example, elastomeric silicone, elastomeric polyurethane, and elastomeric polyisoprene. The organic light emitting display apparatus 10 may be bent or stretched, and the base substrate 710 may be bent or stretched together with the organic light emitting display apparatus 10.

The plurality of protective units C may be spaced apart from each other. Each of the plurality of protective units C may include a pillar 720 protruding from the first surface perpendicularly to the first surface, and a hard coating layer 730 applied on surfaces, e.g., lateral surfaces, of the pillar 720.

The pillar 720 may be formed of the same material as the base substrate 710. For example, the pillar 720 and the base substrate 710 may be integrally formed with each other through a molding process.

The pillar 720 may have a horizontal cross-section that may be formed in various shapes, for example, a square shape and a circular shape. The pillar 720 may be formed through a molding process, the horizontal cross-sectional area of the pillar 720 may increase from an upper portion to a lower portion thereof, and the pillar 720 may be manufactured easily.

The hard coating layer 730 may be formed on the surfaces, e.g., lateral surfaces, of the pillar 720. The hard coating layer 730 may be formed of a material having a pencil hardness of 5H or greater, e.g., urethane, acrylate, or silicon that may be cross-linked.

The hard coating layer 730 may be formed by dipping the pillar 720 in a solution for forming the hard coating layer 730. The hard coating layer 730 may not be formed on surfaces of the base substrate 710 between the pillars 720, and may or may not be formed on an upper surface of the pillars 720.

The above plurality of protective units C may be elastically curved.

FIG. 4 illustrates a cross-sectional view of an operation of the protective sheet 700, for example, a process of protecting the organic light emitting display apparatus 10 by the protective sheet 700 while data is input by using a touch pen S.

As shown in FIG. 4, the touch pen S may move in a direction while contacting the protective sheet 700, a command signal may be input, and the plurality of protective units C may be bent in the same direction as the moving direction of the touch pen S. At least two neighboring protective units C from among the plurality of protective units C may contact each other by the hard coating layers 730. At least four hard coating layers 730 overlap with each other under the touch pen S, and generation of one or more scratches caused by the input unit such as the touch pen S on the organic light emitting display apparatus 10 may be prevented effectively.

At least four hard coating layers 730 may overlap with each other, and the hard coating layer 730 formed on the surface of the pillar 720 may be small in thickness T. For example, the hard coating layer 730 may have the thickness T of about 5 µm to about 30 µm. As described above, if the hard coating layer 730 is relatively thin, generation of crack in the hard coating layers 730 may be prevented even when the plurality of protective units C are bent.

A distance D between the two neighboring protective units C may be half a height L of the pillar 720 or less, and at least two protective units C may overlap with each other when bending the plurality of protective units C. For example, a width W of the pillar 720 may be about 10 μm to about 30 μm for flexibility of the protective units C. The width W of the pillar 720 may be the largest width W when the horizontal cross-sectional area of the pillar 720 changes in the lengthwise direction of the pillar 720.

Although not shown in FIG. 4, an upper surface of the pillar 720 may be convex upwardly, and damage to the protective units C may be prevented, for example, due to the input unit such as the touch pen S, and the hard coating layer 730 may also be formed on the upper surface of the pillar 720.

FIG. 5 illustrates a schematic cross-sectional view of the protective sheet 700 when stretching the organic light emitting display apparatus 10. Referring to FIG. 5, the base substrate 710 may be stretched too, when the organic light emitting display apparatus 10 is stretched. Lower surfaces U2 of the pillars 720, to which stretching force may be applied, may increase in areas thereof, and upper surfaces U1 of the pillars 720 may be stretched less, relatively. A vertical cross-section of the pillar 720 may have a rectangular shape, and the vertical cross-section may be changed to a trapezoidal shape when stretching the protective sheet 700.

Since the hard coating layer 730 is hard, cracks may occur in the hard coating layer 730 when the shape of the pillar 720 on which the hard coating layer 730 is formed is changed.

The following equation 1 calculates a strain generated between the pillar 720 and the hard coating layer 730 when the lower surface U2 of the pillar 720 is stretched by 100% without changing the shape of the upper surface U1 of the pillar 720.

$$\text{strain}(\%) = \left( \sqrt{1 + \left(\frac{W}{2L}\right)^2} - 1 \right) \times 100 \qquad (1)$$

According to equation 1, when the width W of the pillar 720 is ⅓ of the length L of the pillar 720 or less, the strain generated between the pillar 720 and the hard coating layer 730 is 1.5% or less when the lower surface U2 of the pillar 720 is stretched by 100%.

The strain may not affect the hard coating layer 730, and when the width W of the pillar 720 is ⅓ of the length L of the pillar 720 or less, the hard coating layer 730 may be stabilized even when the protective sheet 700 is stretched. The hard coating layer 730 of the protective sheet 700 may not be cracked or delaminated even with the repeated bending or stretching of the organic light emitting display apparatus 10.

As described above, the width W of the pillar 720 may range from 10 μm to 30 μm, flexibility of the protective units C may be maintained, and the length L of the pillar 720 may be 30 μm or greater. If the length L of the pillar 720 is too long, it may be difficult to manufacture the protective units C and the protective units C may not have elasticity. The length L of the pillar 720 may range from 30 μM to 100 μm.

Figure 6:
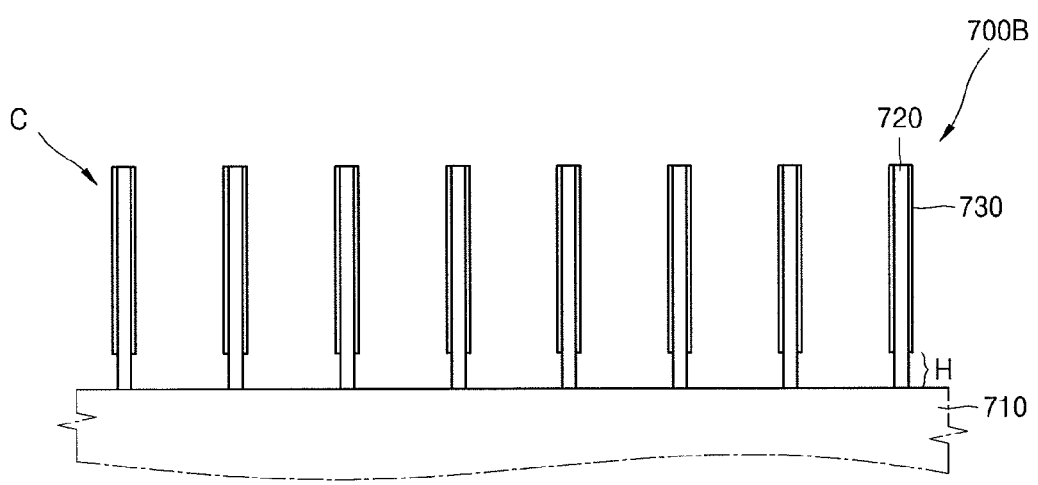
FIG. 6 illustrates a schematic cross-sectional view of a modified example of the protective sheet of the organic light emitting display apparatus of FIG. 1.

FIG. 6 illustrates a schematic cross-sectional view of a modified example of the protective sheet in the organic light emitting display apparatus 10 of FIG. 1. Referring to FIG. 6, a protective sheet 700B may include the base substrate 710 and the plurality of protective units C formed on the first surface of the base substrate 710, and each of the plurality of protective units C may include the pillar 720 protruding from the first surface perpendicularly to the first surface, and the hard coating layer 730 applied on surfaces of the pillar 720.

The base substrate 710 and the pillar 720 are the same as those of FIG. 4, and detailed descriptions thereof are not provided here.

Each of the plurality of protective units C may include a region H on which the hard coating layer 730 is not applied. The region H on which the hard coating layer 730 is not applied may be provided on a bending portion of the protective unit C, and bending property of the protective unit C may be improved.

Figure 7:
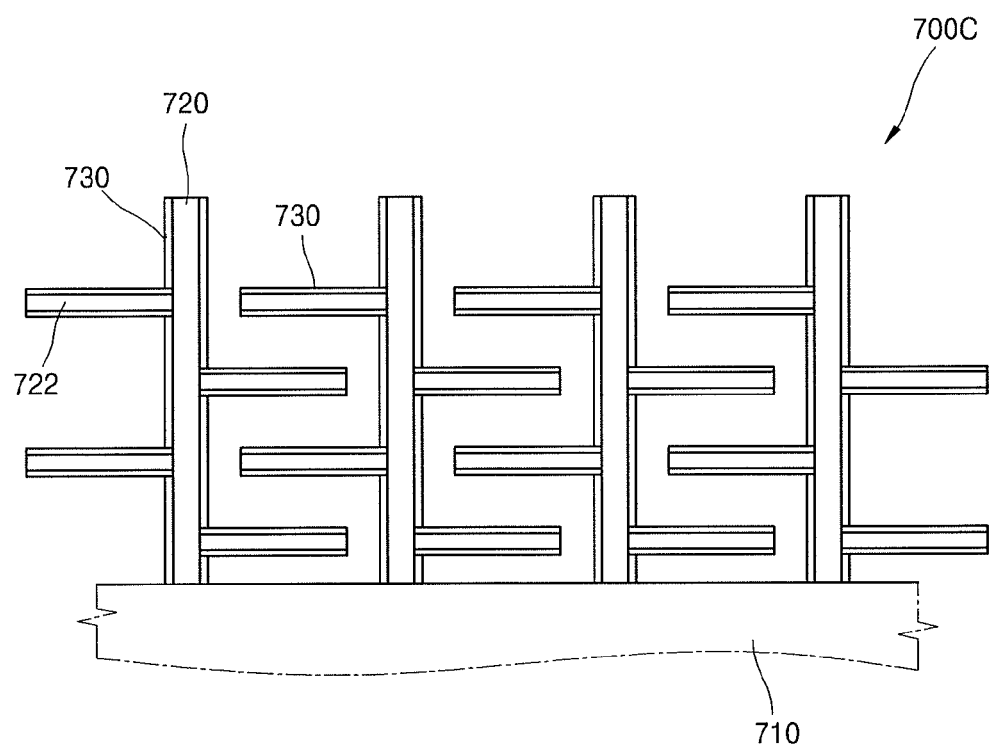
FIG. 7 illustrates a schematic cross-sectional view of another modified example of the protective sheet in the organic light emitting display apparatus of FIG. 1.

FIG. 7 illustrates a schematic cross-sectional view of another modified example of the protective sheet in the organic light emitting display apparatus 10 of FIG. 1. Referring to FIG. 7, a protective sheet 700C may include the base substrate 710, and the plurality of protective units C formed on the first surface of the base substrate 710.

The plurality of protective units C may be spaced apart from each other, and each of the plurality of protective units C may include the pillar 720 protruding from the first surface of the base substrate 710 perpendicularly to the first surface, and the hard coating layer 730 applied on surfaces of the pillar 720.

The base substrate 710 may be formed of a stretchable material, for example, elastomeric silicone, elastomeric polyurethane, and elastomeric polyisoprene.

The pillar 720 may be formed of the same material as the base substrate 710, and the hard coating layer 730 may be formed on the surfaces of the pillar 720.

The plurality of protective units C may be elastically bent, two neighboring protective units C may overlap with each other when being bent, and generation of one or more scratches, for example, due to an input unit such as the touch pen (S of FIG. 4), in the organic light emitting display apparatus 10 may be prevented.

Each of the plurality of protective units C may include a plurality of branches 722 protruding from a side surface of the pillar 720, and the hard coating layer 730 may be applied on surfaces, e.g., lateral surfaces, of the plurality of branches 722. An angle between each of the plurality of branches 722 and the first surface may be greater than 0° and less than 90°.

As described above, the plurality of branches 722 may protrude from the pillar 720, the hard coating layer 730 may be formed on the surfaces, e.g., lateral surfaces, of the plurality of branches 722, and contact between the input unit such as the touch pen (S of FIG. 4) and a region where the hard coating layer 730 is not formed between the pillars 720 may be prevented.

By way of summation and review, flexible display apparatuses may include, for example, stretchable display apparatuses may be stretched or bent into various shapes. A display apparatus may include a hard coating film that may protect the display apparatus from external shock. If a flexible display apparatus and a stretchable display apparatus has a hard coating film, a crack may form in the hard coating film or the hard coating film may be delaminated when bending the flexible display apparatus or stretching the stretchable display apparatus.

As described above, the protective sheet according to the embodiments may have an improved structure, and the hard coating layer may not be cracked or delaminated even with the repeated bending or stretching of the organic light emitting display apparatus.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A protective sheet, comprising:
    a base substrate; and
    a plurality of protective units on a first surface of the base substrate and spaced apart from each other, each of the plurality of protective units including a pillar protruding from the first surface of the base substrate perpendicularly to the first surface, and a hard coating layer on lateral surfaces of the pillar,
    the plurality of protective units being elastically bendable and hard coating layers of neighboring protective units overlapping each other in a direction perpendicular to the first surface of the base substrate when the plurality of protective units are bent.

2. The protective sheet as claimed in claim 1, wherein the base substrate is stretchable, and the pillars include a same material as the base substrate.

3. The protective sheet as claimed in claim 1, wherein each of the plurality of protective units has a lower end portion adjacent to the base substrate on which the hard coating layer is not formed.

4. The protective sheet as claimed in claim 1, wherein a distance between two adjacent protective units is equal to or less than half of a length of the pillar.

5. The protective sheet as claimed in claim 1, wherein, in each of the plurality of protective units, a horizontal cross-sectional area of the pillar continuously increases from an upper portion to a lower portion thereof relative to the base substrate.

6. The protective sheet as claimed in claim 1, wherein, in each of the plurality of protective units, an upper surface of the pillar is convex upward.

7. The protective sheet as claimed in claim 1, wherein the hard coating layer has a thickness of about 5 µm to about 30 µm.

8. A protective sheet, comprising:
    a base substrate; and
    a plurality of protective units on a first surface of the base substrate and spaced apart from each other, each of the plurality of protective units including a pillar protruding from the first surface of the base substrate perpendicularly to the first surface, and a hard coating layer on lateral surfaces of the pillar,
    the plurality of protective units being elastically bendable and hard coating layers of neighboring protective units overlapping each other when the plurality of protective units are bent,
    wherein each of the plurality of protective units includes a plurality of branches protruding from the lateral surfaces of the pillar.

9. The protective sheet as claimed in claim 8, wherein the hard coating layer is on lateral surfaces of the plurality of branches.

10. The protective sheet as claimed in claim 8, wherein an angle between each of the branches and the first surface is greater than 0° and less than 90°.

11. An organic light emitting display apparatus, comprising:
    a substrate;
    a display unit on the substrate;
    a functional layer on the display unit;
    a sealing portion on the substrate along an outer portion of the display unit for bonding the substrate and the functional layer to each other; and
    a protective sheet on the functional layer, the protective sheet including:
    a base substrate; and
    a plurality of protective units on a first surface of the base substrate, the plurality of protective units being spaced apart from each other, and each of the plurality of protective units including a pillar protruding from the first surface of the base substrate perpendicularly to the first surface, and a hard coating layer on lateral surfaces of the pillar, and
    the plurality of protective units being elastically bendable, and hard coating layers of neighboring protective units contacting each other when the plurality of protective units are bent.

12. The organic light emitting display apparatus as claimed in claim 11, wherein the functional layer includes a sealing substrate, a polarization layer, and a touchscreen layer.

13. The organic light emitting display apparatus as claimed in claim 11, wherein each of the plurality of protective units has a lower end portion adjacent to the base substrate on which the hard coating layer is not formed.

14. The organic light emitting display apparatus as claimed in claim 11, wherein a distance between two adjacent protective units is equal to or less than half of a length of the pillar.

15. The organic light emitting display apparatus as claimed in claim 11, wherein, in each of the plurality of protective units, a horizontal cross-sectional area of the pillar increases from an upper portion to a lower portion thereof relative to the base substrate.

16. The organic light emitting display apparatus as claimed in claim 11, wherein, in each of the plurality of protective units, an upper surface of the pillar further from the base substrate is convex upward.

17. The organic light emitting display apparatus as claimed in claim 11, wherein each of the plurality of protective units includes a plurality of branches protruding from the lateral surfaces of the pillar.

18. The organic light emitting display apparatus as claimed in claim 17, wherein the hard coating layer is on lateral surfaces of the plurality of branches.

19. The organic light emitting display apparatus as claimed in claim 17, wherein an angle between each of the branches and the first surface is greater than 0° and less than 90°.

20. The organic light emitting display apparatus as claimed in claim 11, further comprising a filling material which is between the substrate and the functional layer, the filling material covering the display unit.

21. The organic light emitting display apparatus as claimed in claim 20, wherein the substrate, the filling material, the functional layer, and the base substrate are stretchable, and the pillar includes a same material as the base substrate.

* * * * *